(12) United States Patent
Shin

(10) Patent No.: US 9,831,263 B2
(45) Date of Patent: Nov. 28, 2017

(54) SEMICONDUCTOR DEVICE INCLUDING THREE DIMENSIONAL MEMORY STRING

(71) Applicant: SK hynix Inc., Gyeonggi-do (KR)

(72) Inventor: Wan Cheul Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 25 days.

(21) Appl. No.: 15/045,395

(22) Filed: Feb. 17, 2016

(65) Prior Publication Data

US 2017/0062463 A1 Mar. 2, 2017

(30) Foreign Application Priority Data

Sep. 2, 2015 (KR) ........................ 10-2015-0124352

(51) Int. Cl.

| | |
|---|---|
| *H01L 29/66* | (2006.01) |
| *H01L 29/788* | (2006.01) |
| *H01L 27/115* | (2017.01) |
| *H01L 27/11582* | (2017.01) |
| *H01L 29/10* | (2006.01) |
| *H01L 23/528* | (2006.01) |
| *H01L 23/522* | (2006.01) |

(52) U.S. Cl.
CPC ...... *H01L 27/11582* (2013.01); *H01L 23/528* (2013.01); *H01L 23/5226* (2013.01); *H01L 29/1079* (2013.01)

(58) Field of Classification Search
CPC ............ H01L 27/11517; H01L 29/788; H01L 29/42324; H01L 29/792; H01L 29/6684; H01L 29/6825; H01L 27/11582; H01L 23/5226; H01L 29/1079
See application file for complete search history.

(56) References Cited

U.S. PATENT DOCUMENTS

| | | | |
|---|---|---|---|
| 6,770,934 B1* | 8/2004 | Hung ................ | H01L 21/28273 257/315 |
| 9,007,834 B2* | 4/2015 | Rhie ................... | G11C 11/5635 365/185.11 |
| 2013/0161722 A1* | 6/2013 | Son ........................ | H01L 29/78 257/321 |
| 2014/0061750 A1* | 3/2014 | Kwon ................ | H01L 27/1052 257/314 |
| 2015/0228343 A1* | 8/2015 | Park ................. | H01L 29/42328 365/185.18 |
| 2016/0078942 A1* | 3/2016 | Lee .......................... | G11C 8/12 365/185.11 |

FOREIGN PATENT DOCUMENTS

KR 1020080029568 4/2008

* cited by examiner

*Primary Examiner* — Benjamin Sandvik
*Assistant Examiner* — Damon Hillman
(74) *Attorney, Agent, or Firm* — IP & T Group LLP

(57) ABSTRACT

A semiconductor device includes a semiconductor substrate divided into a first area and a second area, the semiconductor substrate including a first dopant of a first type, a first well formed to a first depth in the first area of the semiconductor substrate, the first well including a second dopant of a second type, wherein the second type is different from the first type, a second well including a third dopant of the first type, the second well being surrounded by the first well, and a pipe gate formed on the first area of the semiconductor substrate, the pipe gate being electrically connected to the second well.

14 Claims, 13 Drawing Sheets

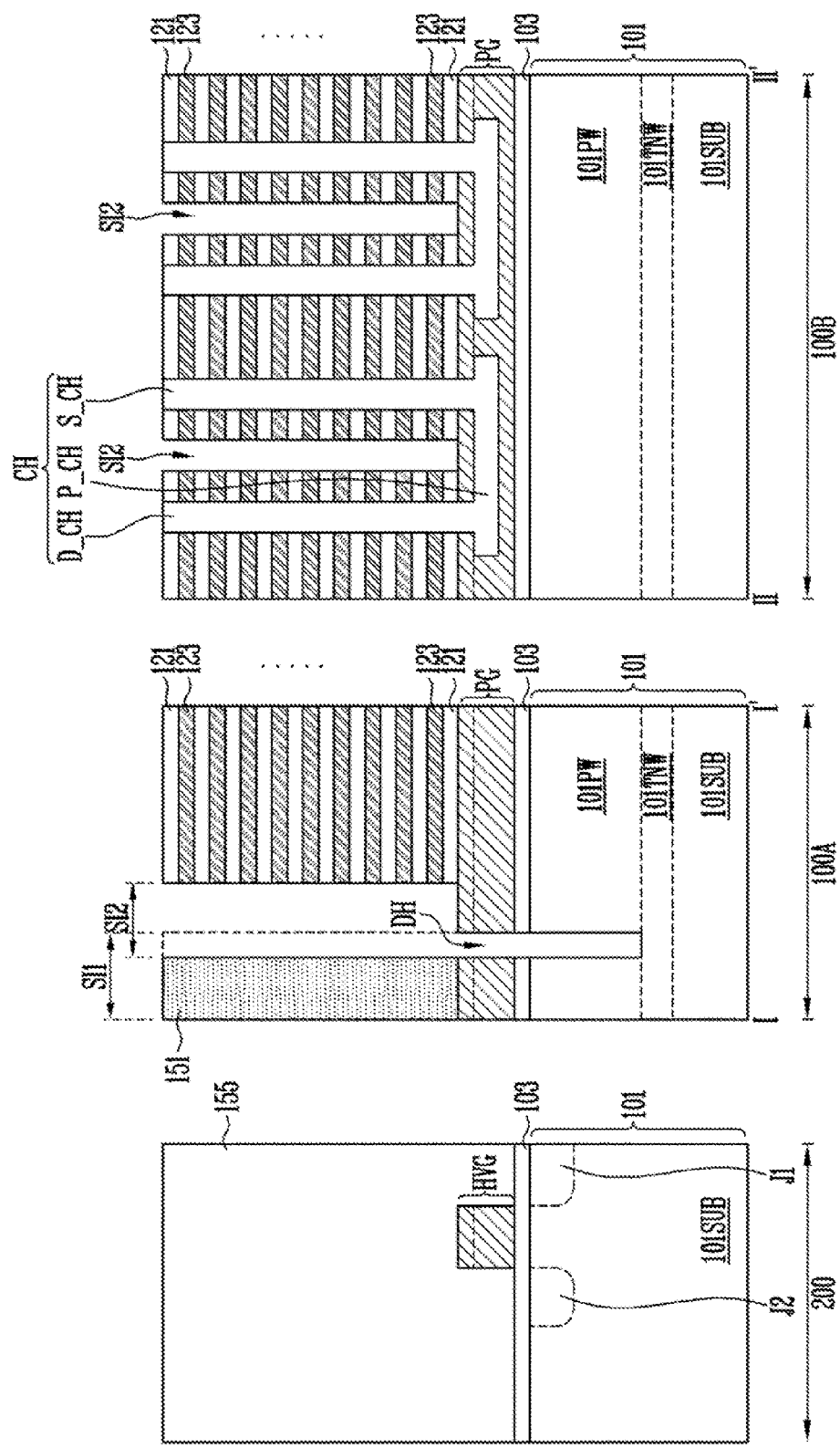

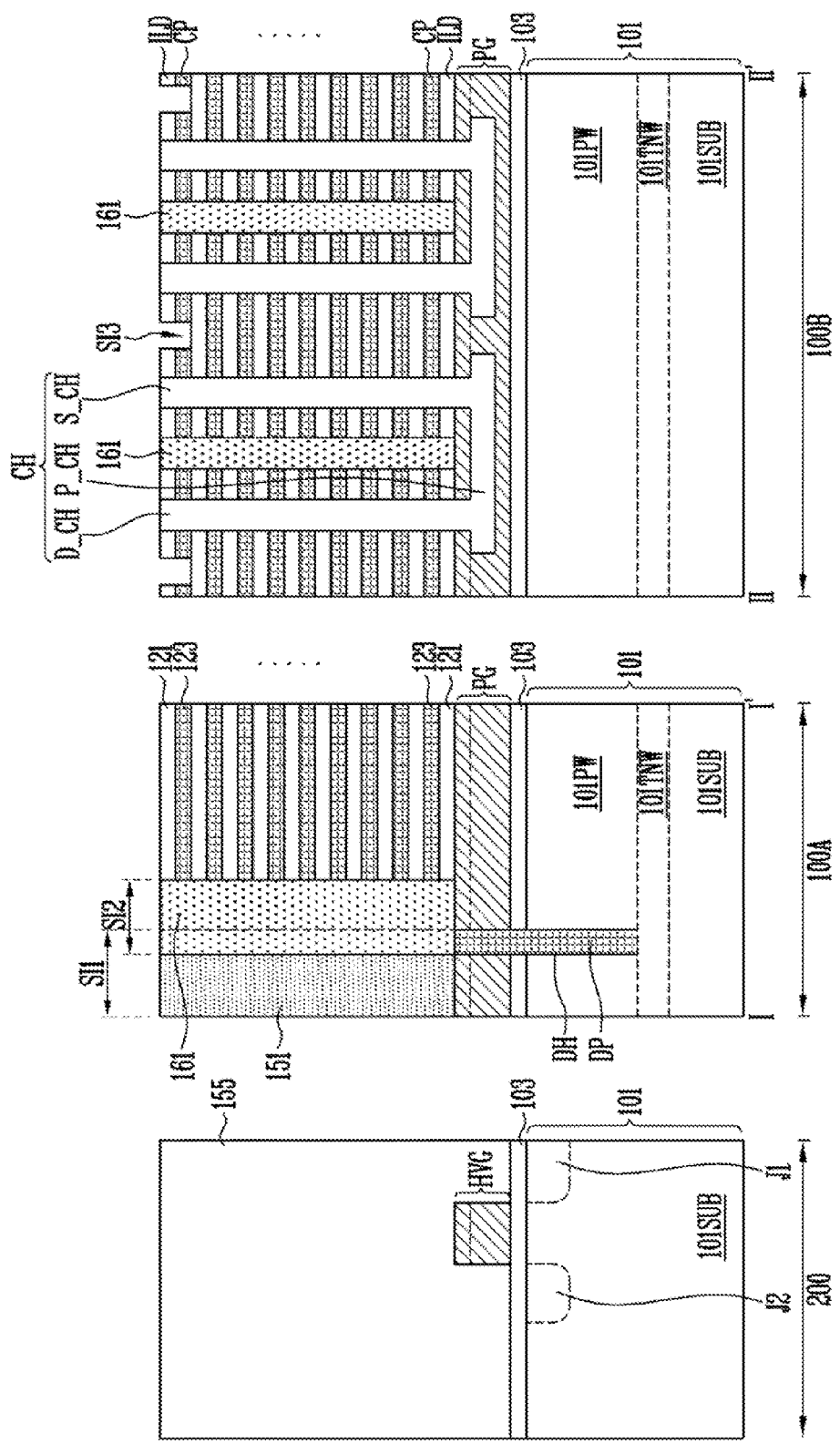

SEMICONDUCTOR DEVICE INCLUDING THREE DIMENSIONAL MEMORY STRING

CROSS-REFERENCE TO RELATED APPLICATION

The present application claims priority to Korean patent Application No. 10-2015-0124352, flied on Sep. 2, 2015, the entire disclosure of which is herein incorporated by reference in its entirety.

BACKGROUND

1. Field

An aspect of the present disclosure relates to a semiconductor device, and more particularly, to a semiconductor device including three-dimensional memory strings.

2. Description of the Related Art

A semiconductor device includes a memory device capable of storing data. The memory device includes a plurality of memory cells capable of storing data. The memory cells may be three-dimensionally arranged on a substrate so as to improve integration of the memory device. The three-dimensionally arranged memory cells are connected in series through a channel layer to constitute a three-dimensional memory string. Various techniques for forming the three-dimensional memory string have been developed.

SUMMARY

Embodiments provide a semiconductor device which can increase the operating reliability of three-dimensional memory strings.

According to an aspect of the present disclosure, there is provided a semiconductor device including: a semiconductor substrate divided into a first area and a second area, the semiconductor substrate including a first dopant of a first type; a first well formed to a first depth in the first area of the semiconductor substrate, the first well including a second dopant of a second type, wherein the second type is different from the first type; a second well including a third dopant of the first type, the second well being surrounded by the first well; and a pipe gate formed on the first area of the semiconductor substrate, the pipe gate being electrically connected to the second well.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Hereinafter, exemplary embodiments of the present disclosure will be described in detail with reference to the accompanying drawings. However, the present disclosure is not limited to the embodiments but may be implemented into different forms. Therefore, the scope of the present disclosure should not be limited to the following embodiments. These embodiments are provided only for illustrative purposes and for full understanding of the scope of the present disclosure by those skilled in the art. Further, the scope of the present disclosure should be understood within the scope of the present disclosure defined by the appended claims.

Figure 1:
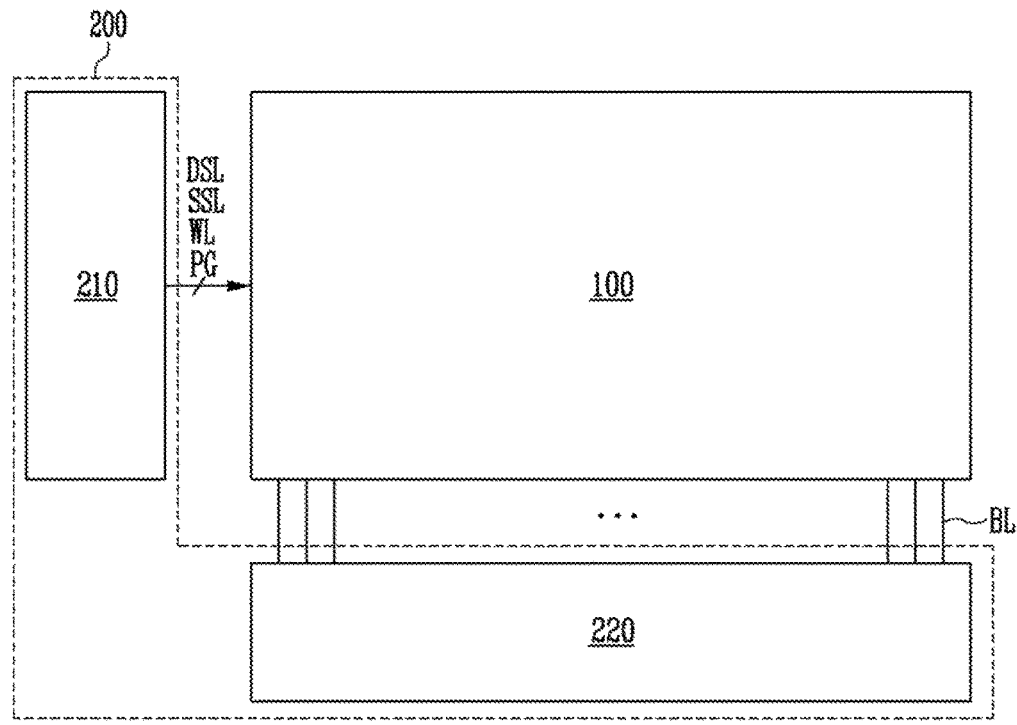
FIG. 1 is a block diagram illustrating a semiconductor device according to an embodiment of the present disclosure.

FIG. 1 is a block diagram illustrating a semiconductor device according to an embodiment of the present disclosure. Referring to FIG. 1, the semiconductor device may include a semiconductor substrate including a first area 100 and a second area 200. The first area 100 is a cell array area in which memory strings are arranged, and the second area 200 is a peripheral circuit area in which peripheral circuits for controlling operations of the memory strings are arranged.

Each of the memory strings formed on the first area 100 may be formed into a three-dimensional structure in which three-dimensionally arranged memory cells are connected by a channel layer. The memory strings may be divided in units of memory blocks. The structure of each memory string will be described later with reference to FIG. 3. A row decoder 210 and a page buffer circuit 220 may be disposed on the second area 200.

The row decoder 210 may be connected to the memory strings formed on the first area 100 through select lines DSL and SSL, a pipe gate PG, and word lines WL. The row decoder 210 may include drive transistors for transmitting operation voltages to the memory strings. For example, the row decoder 210 may include pass transistors for controlling whether operation voltages are to be applied to the select lines DSL and SSL, the pipe gate PG, and the word lines WL.

The page buffer circuit 220 may be connected to the memory strings formed on the first area 100 through bit lines BL. The page buffer circuit 220 may include drive transistors configured to selectively pre-charge the bit lines BL or sense threshold voltages of the memory cells by using potentials of the bit lines BL.

The row decoder 210 and the page buffer circuit 220 are disposed adjacent to the first area 100 in which the memory strings are arranged. In the embodiment of the present disclosure, the first area 100 is separated from the second area 200 by using a well structure so as to prevent a phenomenon in which current is leaked into the first area 100 by operations of drive transistors disposed adjacent to the first area 100 among the drive transistors constituting the row decoder 210 and the page buffer circuit 220.

Figure 2:
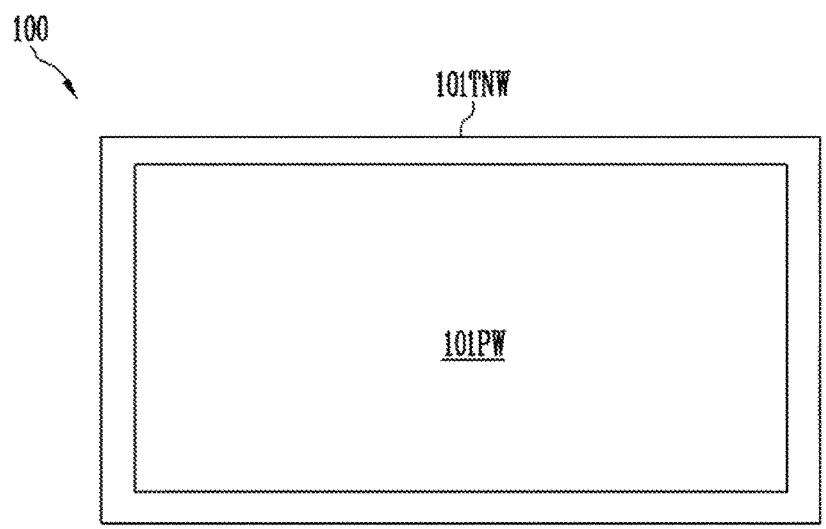
FIG. 2 is a plan view illustrating a well structure of a first area, shown in FIG. 1.

FIG. 2 is a plan view illustrating a well structure of the first area, shown in FIG. 1. The semiconductor substrate according to the embodiment of the present disclosure includes a first dopant of a first type. The first type may be a P type.

A first well 101 TNW may be formed inside the first area 100. The first well 101TNW is formed inside the first area 100, and may electrically separate the first area 100 from the second area (200 of FIG. 1). The first well 101TNW may be disposed so as not to be out of a boundary between the first area 100 and the second area (200 of FIG. 1). A sidewall of the first well 101TNW may be contacted with the semiconductor substrate of the first type at the boundary between the second area (200 of FIG. 1) and the first area 100. The first well 101TNW includes a second dopant of a second type different from the first type. The second type may be an N type.

A second well 101PW may be further formed inside the first area 100. The second well 101PW may be formed inside the first well 101TNW to have a depth shallower than that of the first well 101TNW. The second well 101PW may be surrounded by the first well 101TNW. The second well 101PW may include a third dopant of the first type.

As described above, in the embodiment of the present disclosure, the first well 101TNW of the second type different from that of the semiconductor substrate is formed at the boundary of the first area 100 and the second area 200 so that the first area 100 can be separated from the second area 200. The first well 101TNW may extend along a bottom of the second well 101PW.

Figure 3:
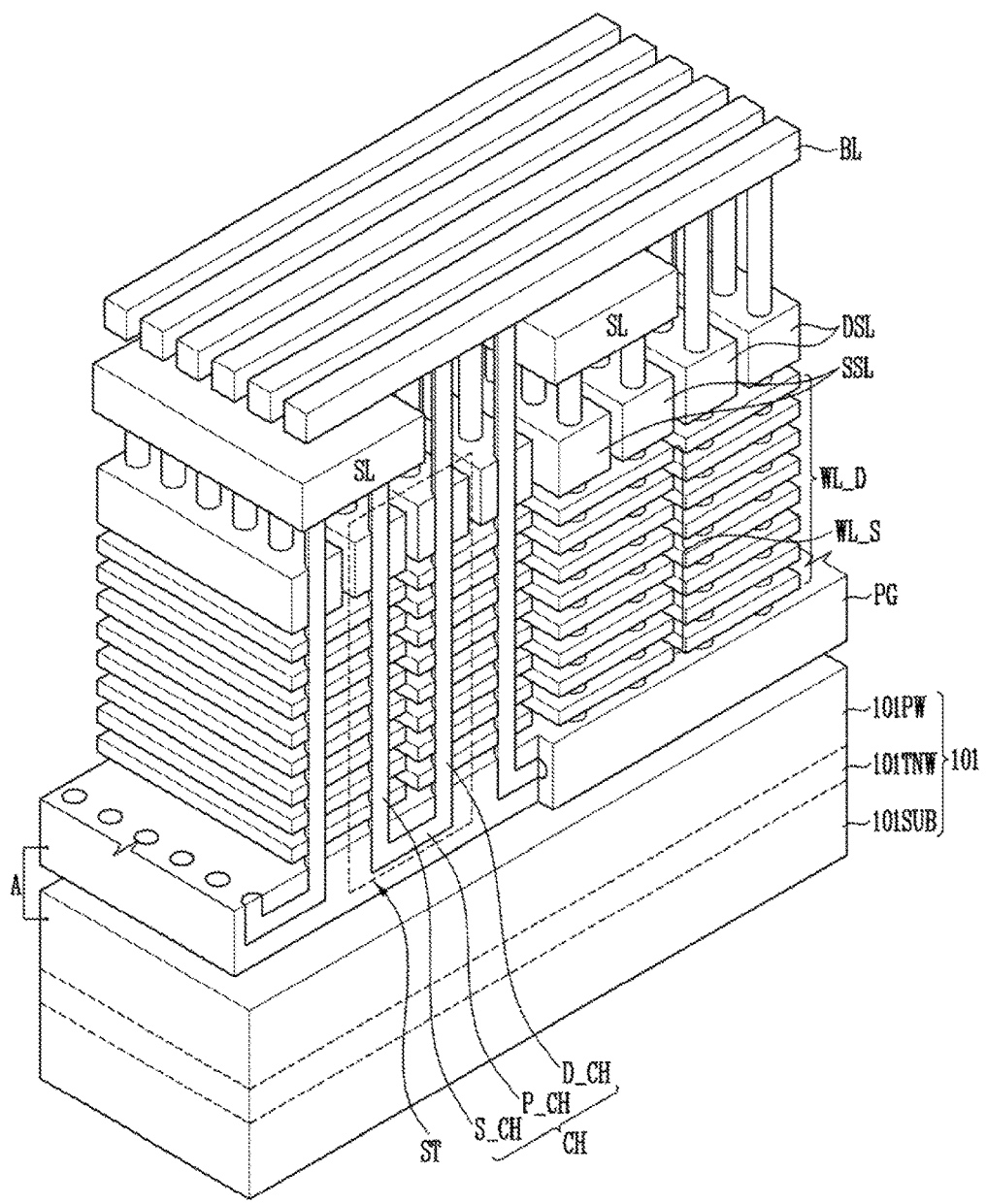
FIG. 3 is a perspective view illustrating a cell structure of the semiconductor device according to an embodiment of the present disclosure.

FIG. 3 is a perspective view illustrating a cell structure of the semiconductor device according to an embodiment of the present disclosure. FIG. 3 illustrates a cell structure including a U-shaped memory string. However, the present disclosure is not limited to the U-shaped memory string. An insulating layer is not illustrated in FIG. 3.

Referring to FIG. 3, the cell structure includes a memory string ST connected between a bit line BL and a common source line SL. The bit line BL may be disposed at a height different from that of the common source line SL. For example, the bit line BL may be disposed above the common source line SL. The bit line BL may extend toward the page buffer circuit 220 shown in FIG. 1. Hereinafter, for convenience of illustration, the extending direction of the bit line BL is defined as a first direction.

The memory string ST may be formed into a three-dimensional structure along a channel layer CH. The channel layer CH includes a pipe channel layer P_CH, a source-side channel layer S_CH, and a drain-side channel layer D_CH. The pipe channel layer P_CH is disposed inside a pipe gate PG formed on a semiconductor substrate 101. The source-side channel layer S_CH and the drain-side channel layer D_CH respectively protrude toward the common source line SL and the bit line BL from the pipe channel layer P_CH. The source-side channel layer S_CH is connected to the common source line SL. The drain-side channel layer D_CH is connected to the bit line BL.

The semiconductor substrate 101 may include a base area 101SUB including the first dopant of the first type, a first well 101TNW formed in the base area 101SUB to have a first depth, and a second well 101PW formed in the first well 101TNW to have a second depth shallower than the first depth. A lower portion and sidewalls of the second well 101PW may be surrounded by the first well 101TNW as described in FIGS. 2 and 3. Dopants implanted into the first well 101TNW and the second well 101PW are different from each other, as described in FIG. 2.

The pipe gate PG is formed on the first area of the semiconductor substrate 101. As shown in A, the pipe gate PG may be connected to the second well 101PW of the semiconductor substrate 101. The connection relationship between the second well 101PW and the pipe gate PG will be described later with reference to FIGS. 4A and 4B.

The source-side channel layer S_CH is surrounded by source-side conductive patterns SSL and WL_S disposed at different heights or levels from each other. The source-side conductive patterns SSL and WL_S are disposed between the common source line SL and the pipe gate PG. The source-side conductive patterns include source-side word lines WL_S and a source select line SSL. The source-side word lines WL_S are disposed at different heights or levels from each other. The source select line SSL is stacked on the source-side word lines WL_S and spaced apart from the source-side word lines WL_S. A one- or two- or more-layered source select line SSL may be stacked between the source-side word lines WL_S and the common source line SL. In this figure, it is illustrated that a one-layered source select line SSL is stacked between the source-side word lines WL_S and the common source line SL, but the present disclosure is not limited thereto.

The drain-side channel layer D_CH is surrounded by drain-side conductive patterns DSL and WL_D disposed at different heights or levels from each other. The drain-side conductive patterns DSL and WL_D are disposed between the bit line BL and the pipe gate PG. The drain-side conductive patterns include drain-side word lines WL_D and a drain select line DSL. The drain-side word lines WL_D are disposed at different heights or levels from each other. The drain select line DSL is stacked on the drain-side word lines WL_D and spaced apart from the drain-side word lines WL_D. A one- or two- or more-layered drain select line DSL may be stacked between the drain-side word lines WL_D and the bit line BL. In this figure, it is illustrated that a one-layered drain select line DSL is stacked between the drain-side word lines WL_D and the bit line BL, but the present disclosure is not limited thereto.

The pipe gate PG, the source-side conductive patterns SSL and WL_S, and the drain-side conductive patterns DSL and WL_D, which are described above, extend to the row decoder shown in FIG. 1, and may be stacked in a step structure. The source-side conductive patterns SSL and WL_S and the drain-side conductive patterns DSL and WL_D may extend along a second direction intersecting the first direction.

Although not shown in this figure, the outer wall of the channel layer CH is surrounded by a multi-layered memory layer including a tunnel insulating layer, a data storage layer, and a blocking insulating layer. Each of the source-side conductive patterns SSL and WL_S, the drain-side conductive patterns DSL and WL_D, and the pipe gate PG surrounds the channel layer CH with the multi-layered memory layer interposed therebetween.

According to the above-described structure, a pipe transistor is formed at an intersection portion of the pipe gate PG and the pipe channel layer P_CH. Drain-side memory cells are formed at intersection portions of the drain-side word lines WL_D and the drain-side channel layer D_CH. Source-side memory cells are formed at intersection portions of the source-side word lines WL_S and the source-side channel layer S_CH. A source select transistor is formed at an intersection portion of the source select line SSL and the source-side channel layer S_CH. A drain select transistor is formed at an intersection portion of the drain select line DSL and the drain-side channel layer D_CH. Accordingly, the drain select transistor, the drain-side memory cells, the pipe transistor, the source-side memory cells, and the source select transistor, which are connected in series along the channel layer CH, can constitute a U-shaped memory string ST. The U-shaped memory string ST is connected between the bit line BL and the common source line SL, to constitute a three-dimensional memory device.

Figure 4A:
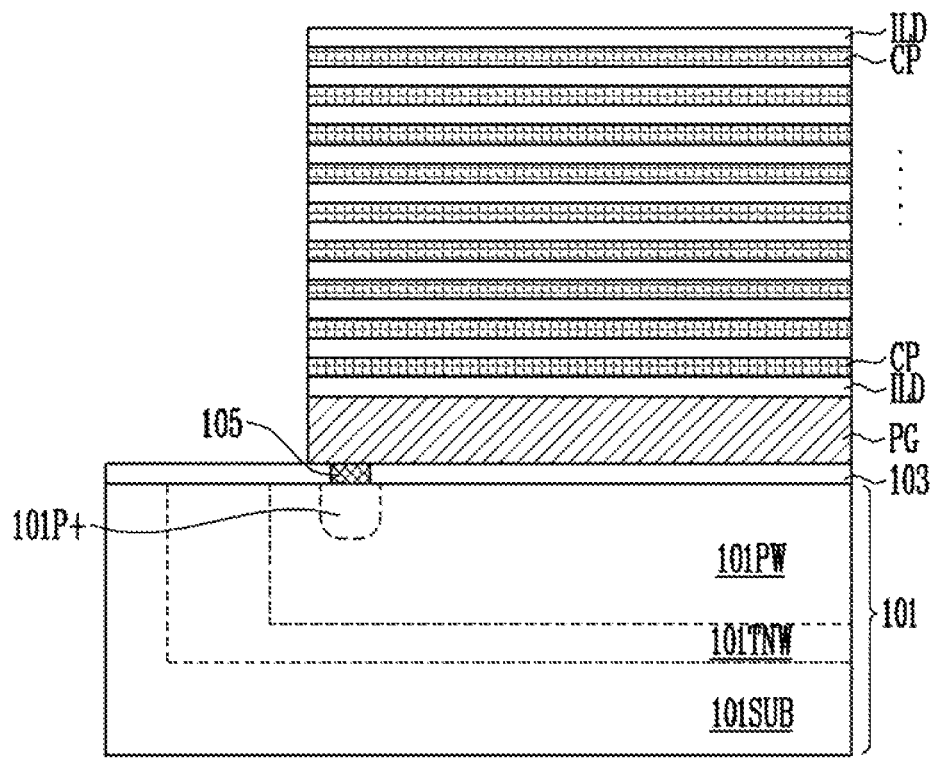
FIGS. 4A and 4B are sectional views illustrating various embodiments of a connection relationship between a pipe gate and a second well.
Figure 4B:
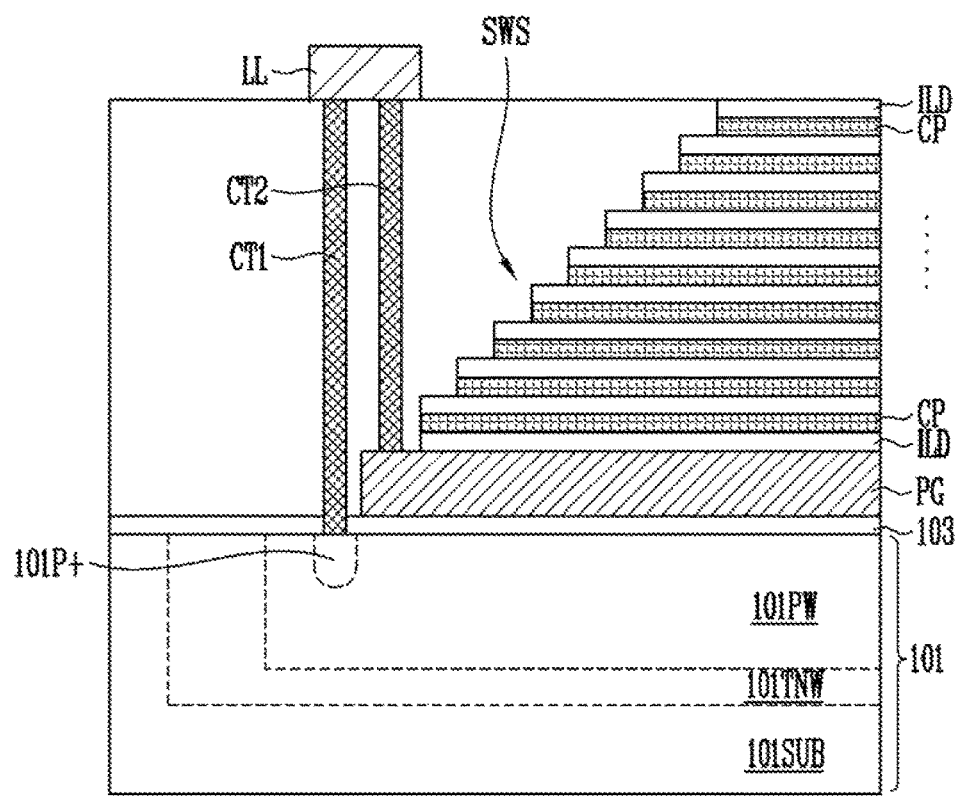

FIGS. 4A and 4B are sectional views illustrating various embodiments of a connection relationship between the pipe gate and the second well. FIG. 4A is a sectional view of a structure formed at the edge of the first area of the semiconductor substrate 101, which is taken along the first direction. FIG. 4B is a sectional view of the structure formed at the edge of the first area of the semiconductor substrate 101, which is taken along the second direction.

Referring to FIGS. 4A and 4B, the first area of the semiconductor substrate 101, as described in FIG. 3, may include a base area 101SUB, a first well 101 TNW, and a second well 101PW. The lower portion and the sidewalls of the second well 101PW may be surrounded by the first well 101TNW. A sidewall and a bottom of the first well 101TNW may be contacted with the base area 101SUB. The base area 101SUB may extend from the sidewall of the first well 101TNW to the second area.

A gate insulating layer 103 may be disposed between the semiconductor substrate 101 and the pipe gate PG. Interlayer dielectric layers ILD and conductive patterns CP are alternately stacked on the pipe gate PG. The conductive patterns CP may be the source-side conductive patterns or the drain-side conductive patterns, which are described in FIG. 3.

As shown in FIG. 4A, in an embodiment of the present disclosure, a contact plug 105 may be further formed between the pipe gate PG and the second well 101PW. The contact plug 105 is contacted with the top surface of the second well 101PW by penetrating the gate insulating layer 103. The contact plug 105 may extend toward the pipe gate PG from the top surface of the second well 101PW and contact with the bottom surface of the pipe gate PG. The contact plug 105 is contacted with a well pick-up area 101P+ formed in a partial area of the second well 101PW. The well pick-up area 101P+ includes a fourth dopant of the first type, which is identical to the third dopant of the second well 101PW. The concentration of the fourth dopant is higher than that of the third dopant.

As shown in FIG. 4B, in another embodiment of the present disclosure, a first contact plug CT1 connected to the second well 101PW and a second contact plug CT2 connected to the pipe gate PG exposed through a step structure SWS are connected to each other by a conductive layer LL so that the pipe gate PG and the second well 101PW can be electrically connected to each other. The step structure SWS may be configured with the pipe gate PG and end portions of the conductive patterns CP. In the step structure SWS, the conductive patterns CP are formed shorter as they are located at a higher level. The first contact plug CT1 is contacted with a well pick-up area 101P+ formed in a partial area of the second well 101PW. The well pick-up area 101P+ includes a fourth dopant of the first type, which is identical to the third dopant of the second well 101PW. The concentration of the fourth dopant is higher than that of the third dopant.

As described above, in the embodiments of the present disclosure, the pipe gate PG and the second well 101PW are electrically connected to each other in various manners so that signals applied to the pipe gate PG can be applied to the second well 101PW.

Figure 5A:
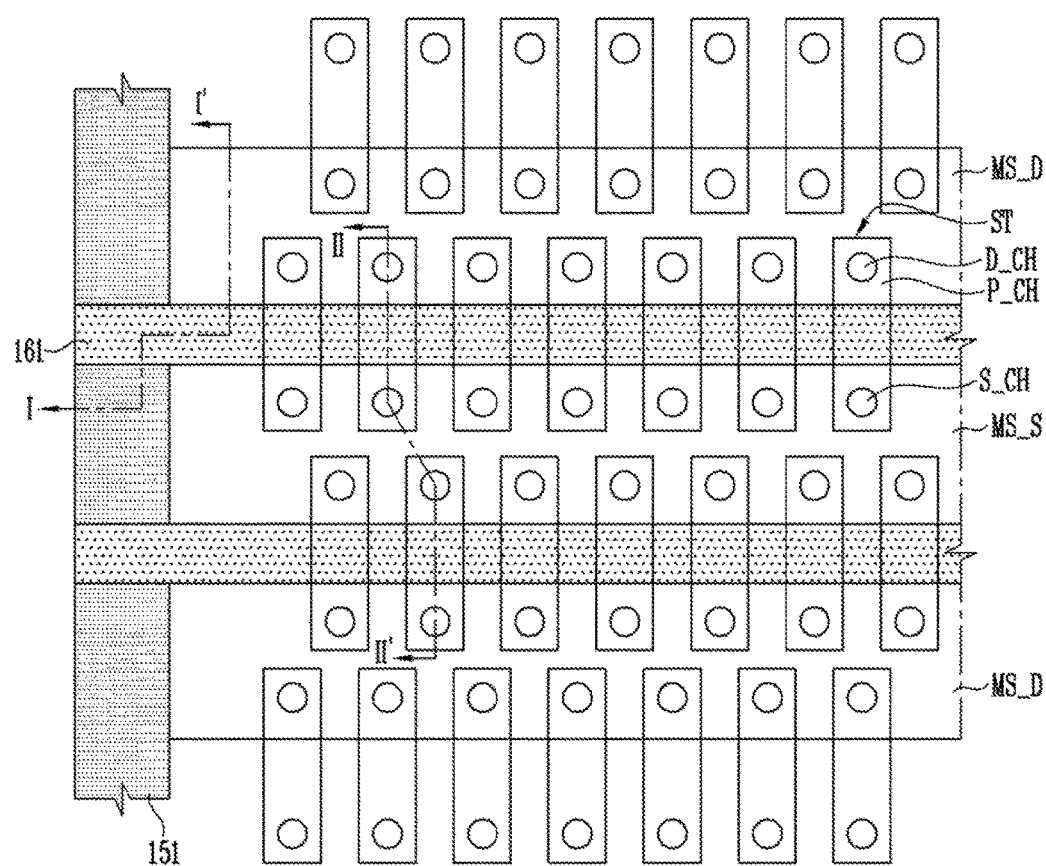
FIGS. 5A to 5C are views illustrating first and second slit overlapping portions of the semiconductor device according to an embodiment of the present disclosure.
Figure 5B:
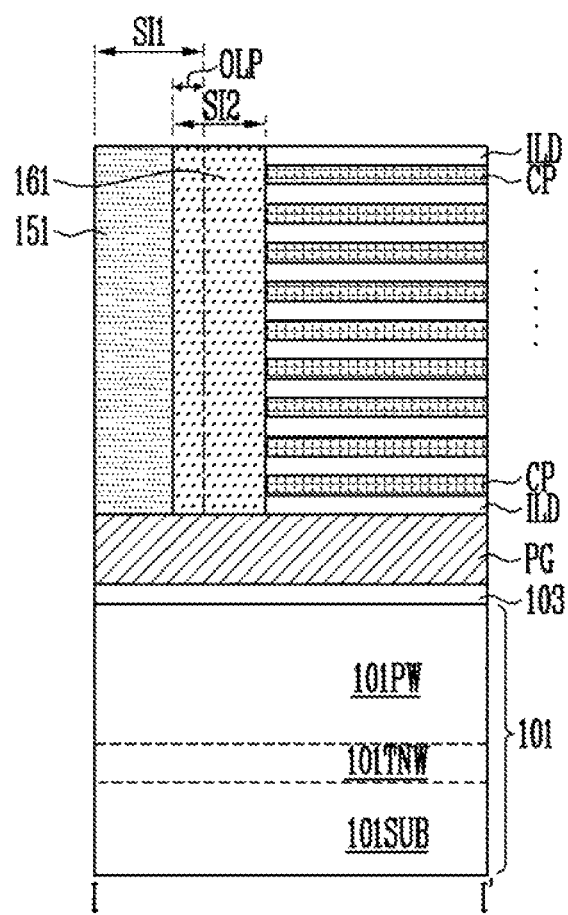
Figure 5C:
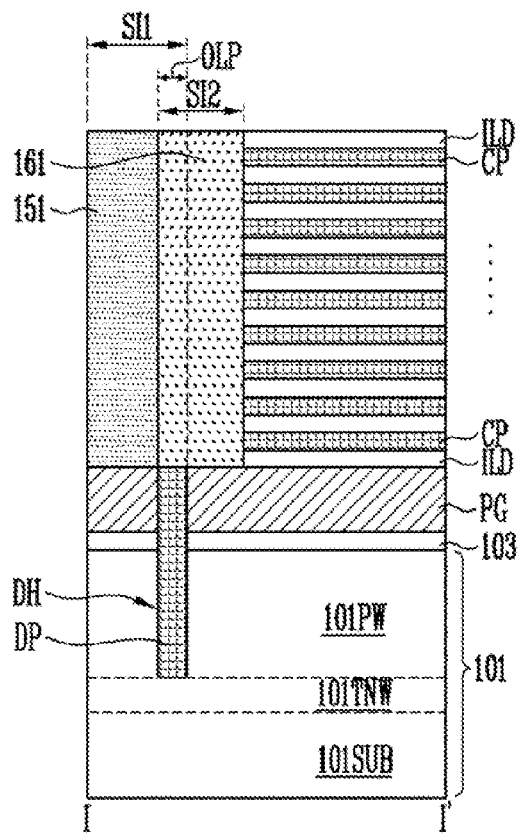

FIGS. 5A to 5C are views illustrating first and second slit overlapping portions of the semiconductor device according to an embodiment of the present disclosure. FIG. 5A is a plan view illustrating a portion of a memory block. FIGS. 5B and 5C are sectional views taken along line "I-I'" shown in FIG. 5A.

Referring to FIG. 5A, the memory block includes a plurality of memory strings ST arranged in a matrix form. The structure of the memory string ST is the same as described in FIG. 3.

The memory string ST includes a pipe channel layer P_CH, a drain-side channel layer D_CH extending from the pipe channel layer P_CH, and a source-side channel layer S_CH extending from the pipe channel layer P_CH. The drain-side channel layer D_CH is surrounded by a drain-side stacked structure MS_D, and the source-side channel layer S_CH is surrounded by a source-side stacked structure MS_S.

The memory block includes the source-side stacked structure MS_S and the drain-side structure MS_D. The memory block is divided by a first slit insulating layer 151 formed inside a first slit. That is the first slit insulating layer 151 is formed at a circumference of the memory block.

The source-side stacked structure MS_S and the drain-side stacked structure MS_D of the memory block are separated with a second slit insulating layer 161 interposed therebetween. Here, the second slit insulating layer 161 is formed inside a second slit. The second slit insulating layer 161 may extend toward the first slit insulating layer 151 from between the source-side stacked structure MS_S and the drain-side stacked structure MS_D. An end portion of the second slit insulating layer 161 may extend to penetrate the sidewall of the first slit insulating layer 151.

Referring to FIGS. 5B and 5C, each of the source-side stacked structure MS_S and the drain-side stacked structure MS_D includes interlayer dielectric layers ILD and conductive patterns CP, which are alternately stacked on a pipe gate PG. The pipe gate PG is disposed on a semiconductor substrate 101 with a gate insulating layer 103 interposed therebetween. The semiconductor substrate 101, as described in FIG. 3, may include a base area 101SUB, a first well 101TNW, and a second well 101PW.

The interlayer dielectric layers ILD and the conductive patterns CP, which are alternately stacked on the pipe gate PG, are penetrated by a first slit SI1 defining units of memory blocks and a second slit SI2 defining the source-side stacked structure and the drain-side stacked structure. An end portion of the second slit SI2 may overlap a portion of the first slit SI1.

Here, for convenience of illustration, the area in which the first and second slits SI1 and SI2 overlap each other is defined as a slit overlapping area OLP. The inside of the first slit SI1 not overlapping the second slit SI2 is filled with the first slit insulating layer 151, and the inside of the second slit SI2 is filled with the second slit insulating layer 161. One end of the second slit insulating layer 161 penetrating the sidewall of the first slit insulating layer 151 is disposed in the slit overlapping area OLP.

As shown in FIG. 5B, if the pipe gate PG is not excessively etched in the process of forming the second slit SI2, the pipe gate PG may be contacted with the one end of the second slit insulating layer 161 disposed in the slit overlapping area OLP.

As shown in FIG. 5C, when the pipe gate PG is excessively etched in the process of forming the second slit SI2, a dummy hole DH may be formed at a lower portion of the slit overlapping area OLP. The dummy hole DH may extend to the inside of the semiconductor substrate 101 by penetrating the pipe gate PG. A dummy pattern DP may be disposed inside the dummy hole DH. The dummy pattern DP may extend down to the inside of the semiconductor substrate 101 by penetrating the pipe gate PG at the lower portion of the slit overlapping area OLP. The dummy pattern DP is simultaneously formed with the conductive patterns CP in the process of forming the conductive patterns CP. Therefore, the dummy pattern DP may be formed of the same conductive material as the conductive patterns CP.

The semiconductor substrate 101 and the pipe gate PG may be electrically connected by the above-described dummy pattern DP. According to the embodiment of the present disclosure, the first and second areas of the semiconductor substrate 101 are separated from each other by the first well 101TNW, and thus it is possible to prevent the pipe gate PG being electrically connected to the second area via the dummy pattern DP.

Figure 6:
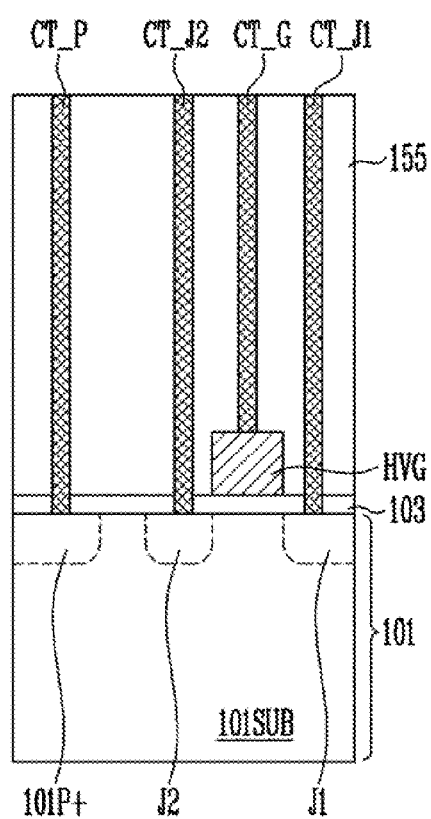
FIG. 6 is a sectional view illustrating a drive transistor according to an embodiment of the present disclosure.

FIG. 6 is a sectional view illustrating a drive transistor according to an embodiment of the present disclosure. Referring to FIG. 6, the drive transistor may be a high-voltage transistor driven by a high voltage. The high-voltage transistor may be an NMOS transistor. The high-voltage transistor is disposed on the second area 200 of the semiconductor substrate 101, separated from the first area 100 by the above-described first well 101TNW. See FIGS. 1, 2, 4B, and 6. The high-voltage transistor may be one constituting the row decoder 210 shown in FIG. 1 or one constituting the page buffer circuit 220 shown in FIG. 1. The high-voltage transistor may be disposed adjacent to the first area 100. The high-voltage transistor includes a gate pattern HVG, a first junction area J1, and a second junction area J2.

The gate pattern HVG is formed on the base area 101SUB of the semiconductor substrate 101 with the gate insulating layer 103 interposed therebetween. The first and second junction areas J1 and J2 are formed in the base area 101SUB at both sides of the gate pattern HVG. Any one of the first and second junction areas J1 and J2 is used as a source area, and the other of the first and second junction areas J1 and J2 is used as a drain area. According to the embodiment of the present disclosure, although a high voltage is applied to any one of the first and second junction areas J1 and J2 of the high-voltage transistor disposed adjacent to the first area 100, the second area 200 to which the high voltage is applied is electrically separated from the dummy pattern DP (shown in FIG. 5C) by the first well 101TNW which is disposed in the first area 100. Thus, according to the embodiment of the present disclosure, it is possible through the first well 101TNW, to prevent the second area to which the high voltage is applied through the dummy pattern from being electrically connected to the pipe gate PG (shown in FIG. 5C).

A pick-up area 101P+ may be formed at a portion of the base area 101SUB disposed in the second area 200. The pick-up area 101P+ may include a fifth dopant of the first type. The fifth dopant may be implanted into the pick-up area 101P+ with a concentration higher than that of the first dopant included in the base area 101SUB.

The pick-up area 101P+ may be connected to a pick-up contact plug CT_P penetrating a planarized insulating layer 155 covering the high-voltage transistor. The first junction area J1 may be connected to a first junction contact plug CT_J1 penetrating the planarized insulating layer 155. The second junction area J2 may be connected to a second junction contact plug CT_J2 penetrating the planarized insulation layer 155. The gate pattern HVG may be connected to a gate contact plug CT_G penetrating the planarized insulating layer 155.

FIGS. 7 to 9B are sectional views illustrating a fabrication method of the semiconductor device according to an embodiment of the present disclosure. In FIGS. 7 to 9B, 200 illustrates a second area of a semiconductor substrate, 100A illustrates a first area of the semiconductor substrate, which is taken along line "I-I'" shown in FIG. 5A, and 100B illustrates the first area of the semiconductor substrate, which is taken along line "II-II'" shown in FIG. 5A.

Figure 7:
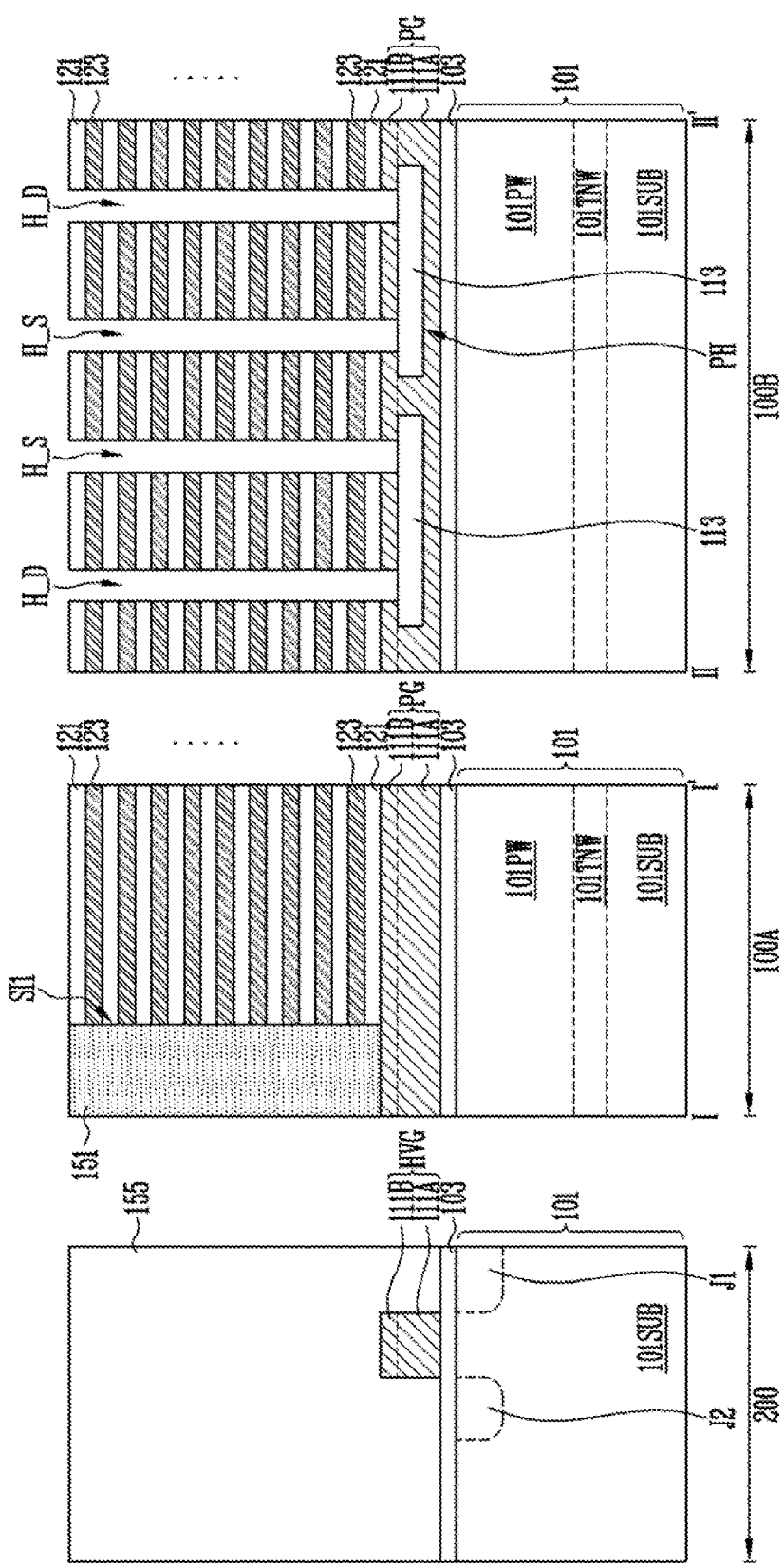
FIGS. 7 to 9B are sectional views illustrating a fabrication method of the semiconductor device according to an embodiment of the present disclosure.

FIG. 7 is a sectional view illustrating a first slit forming process of defining units of memory blocks. Referring to FIG. 7, a semiconductor substrate 101 of a first type is provided. The semiconductor substrate 101 of the first type is configured with a base area 101SUB including a first dopant of the first type. The first type may be a P type.

Subsequently, a second dopant of a second type different from the first type is implanted into a first area of the semiconductor substrate 101 to a first depth, thereby forming a first well 101 TNW. The second type may be an N type. After that, a third dopant of the first type is implanted to a second depth shallower than the first depth of the first well 101TNW, thereby forming a second well 101PW in the first well 101TNW.

A gate insulating layer 103 is formed on the semiconductor substrate 101 in which a well structure including the first and second wells 101TNW and 101PW is formed. The gate insulating layer 103 may be formed by oxidizing a surface of the semiconductor substrate 101 or by depositing an oxide layer on the semiconductor substrate 101.

After that, a first conductive layer 111A is formed on the gate insulating layer 103. Before the first conductive layer 111A is formed, the contact plug 105 shown in FIG. 4A may be further formed. After the first conductive layer 111A is formed, a pipe hole PH is formed by etching a portion of the first conductive layer 111A. The pipe hole PH is disposed on the first area 100B of the semiconductor substrate 101. After that, the pipe hole PH is filled with a sacrificial layer 113.

Subsequently, a second conductive layer 111B may be further formed on the first conductive layer 111A including the pipe hole PH filled with the sacrificial layer 113. After that, a pipe gate PG and a gate pattern HVG are formed by etching the first and second conductive layers 111A and 111B. The pipe gate PG is formed on the first area 100A and 100B of the semiconductor substrate 101, and the gate pattern HVG is formed on the second area 200 of the semiconductor substrate 101.

Subsequently, a dopant is implanted into the semiconductor substrate 101 at both sides of the gate pattern HVG, thereby forming first and second junction areas J1 and J2. Accordingly, a drive transistor including the gate pattern HVG, the first junction area J1, and the second junction area J2 can be formed.

After that, first material layers 121 and second material layers 123 are alternately stacked on the semiconductor substrate 101 on which the pipe gate PG and the drive transistor are formed. The second material layers 123 define areas in which conductive patterns are disposed, and the first material layers 121 define areas in which interlayer dielectric layers are disposed. The second material layers 123 are formed of a material different from that of the first material layers 121. For example, the first material layers 121 may be formed of an insulating material for the interlayer dielectric layer, and the second material layers 123 may be formed of an insulating material serving as sacrificial layers, which have an etching selection ratio with respect to the first material layers 121. In this case, the first material layers 121 may be formed of silicon oxide layers, and the second material layers 123 may be formed of silicon nitride layers. When both the first and second material layers 121 and 123 are formed of an insulating material, it is possible to lower the degrees of difficulty of etching processes for forming first and second through-holes H_S and H_D, a first slit SI1, and a second slit.

After the first and second material layers 121 and 123 are formed, a step structure may be formed by etching the first and second material layers 121 and 123. In this instance, the first and second material layers 121 and 123 on the second area 200 may be removed. After that, a planarized insulating layer 155 may be formed to cover the step structure and the drive transistor.

Subsequently, the slit SI1 is formed to separate the first and second material layers 121 and 123 in units of memory blocks by penetrating the first and second material layers 121 and 123, and the inside of the first slit SI1 is filled with a first slit insulating layer 151.

After that, at least one pair of the first and second through-holes H_D and H_S are formed to expose the sacrificial layer 113 by penetrating the first and second material layers 121 and 123. The first and second through-holes H_D and H_S may further penetrate the second conductive layer 111B, to be connected to the pipe hole PH.

The process of forming the step structure, the process of the forming the first slit SI1, and the process of forming the first and second through-holes H_D and H_S are not limited to the above-described order, and may be performed in various orders.

Figure 8A:
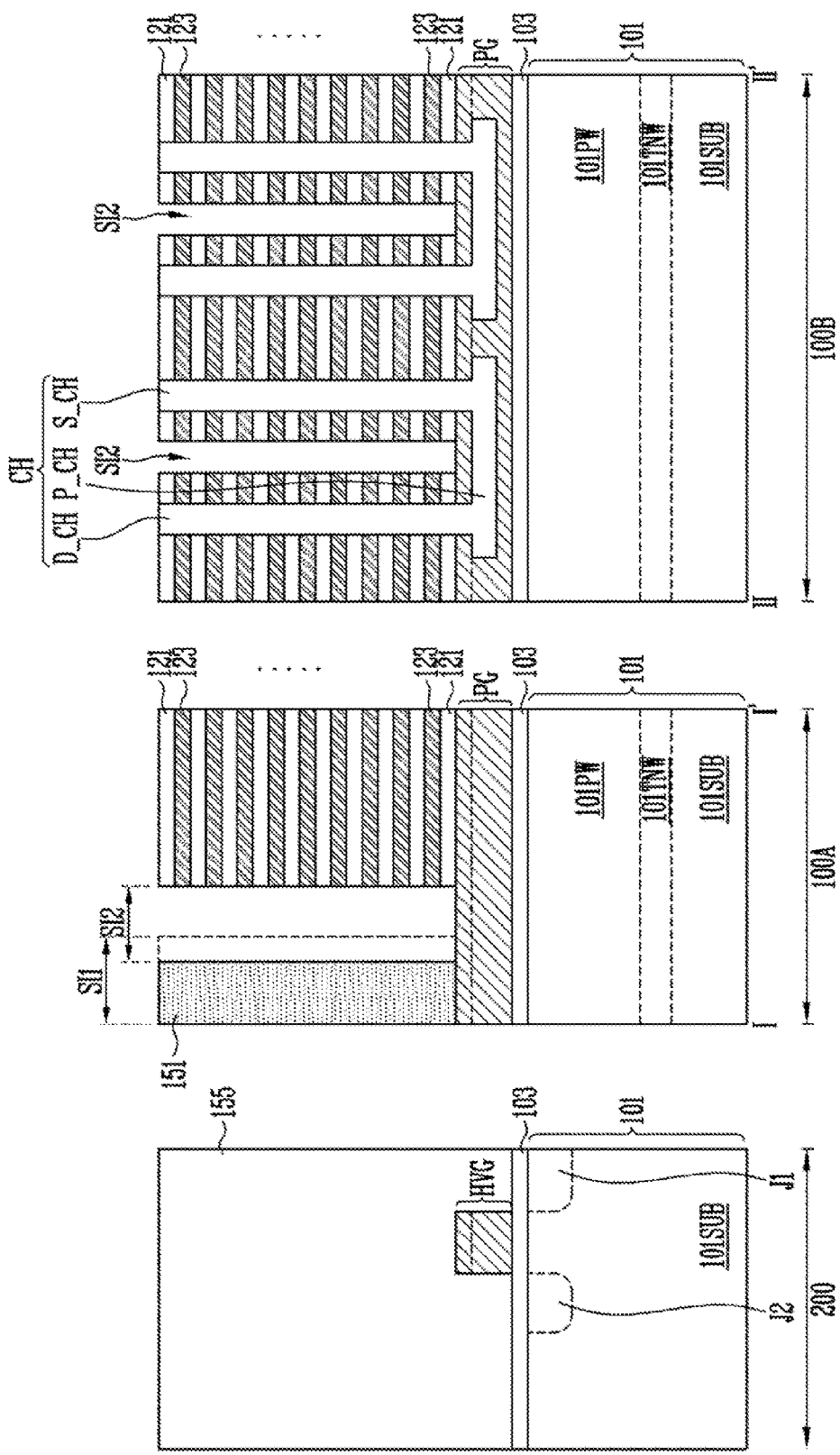

FIGS. 8A and 8B are sectional views illustrating a process of forming a second slit SI2. Referring to FIGS. 8A and 8B, the pipe hole PH (shown in FIG. 7) is opened by removing the sacrificial layer 113 (shown in FIG. 7) exposed through the first and second through-holes H_D and H_S. After that, the pipe hole PH (shown in FIG. 7) and the first and second through-holes H_D and H_S may be filled with a semiconductor layer, thereby forming a channel layer CH. The channel layer CH may be divided into a pipe channel layer P_CH filled in the pipe hole, a drain-side channel layer D_CH filled in the first through-hole, and a source-side channel layer S_CH filled in the second through-hole. Before the channel layer CH is formed, a tunnel insulating layer (not shown) may be further formed along surfaces of the pipe hole, the first through-hole, and the second through-hole. Before the tunnel insulating layer is formed, a data storage layer (not shown) may be further formed along the surfaces of the pipe hole, the first through-hole, and the second through-hole. Before the data storage layer is formed, a blocking insulating layer (not shown) may be further formed along the surfaces of the pipe hole, the first through-hole, and the second through-hole. The tunnel insulating layer may be formed of a silicon oxide layer. The data storage layer may be formed of a silicon nitride layer in which a charge trapping is possible. The blocking insulating layer may be formed of a silicon oxide layer, or formed of a high-dielectric insulating layer having a dielectric constant higher than that of silicon oxide. For example, the blocking insulating layer may be formed of $Al_2O_3$.

After the channel layer CH is formed, a second slit SI2 penetrating the first and second material layers 121 and 123 between the drain-side channel layer D_CH and the source-side channel layer S_CH. The second slit SI2 separates the first and second material layers 121 and 123 into a first stacked structure surrounding the drain-side channel layer D_CH and a second stacked structure surrounding the source-side channel layer S_CH. The second slit SI2 may include an end portion extending toward the first slit SI1 to overlap the first slit SI1. While the first and second material layers 121 and 123 are being etched so as to form the second slit SI2, a portion of the first slit insulating layer 151 may be etched. In this case, before the shape of the second slit SI2 is completed, the pipe gate PG under a portion of the first slit SI1, which overlaps the second slit SI2, may be exposed.

As shown in FIG. 8A, the one area of the pipe gate PG, exposed in the process of forming the second slit SI2, may not be etched until the process of forming the second slit SI2 is completed.

Alternatively, as shown in FIG. 8B, the pipe gate PG which is exposed in the process of forming the second slit SI2 may be excessively etched while the process of forming the second slit SI2 is being performed. In this case, a dummy hole DH penetrating the pipe gate PG may be formed. The dummy hole DH may extend to the inside of the semiconductor substrate 101.

Figure 9A:
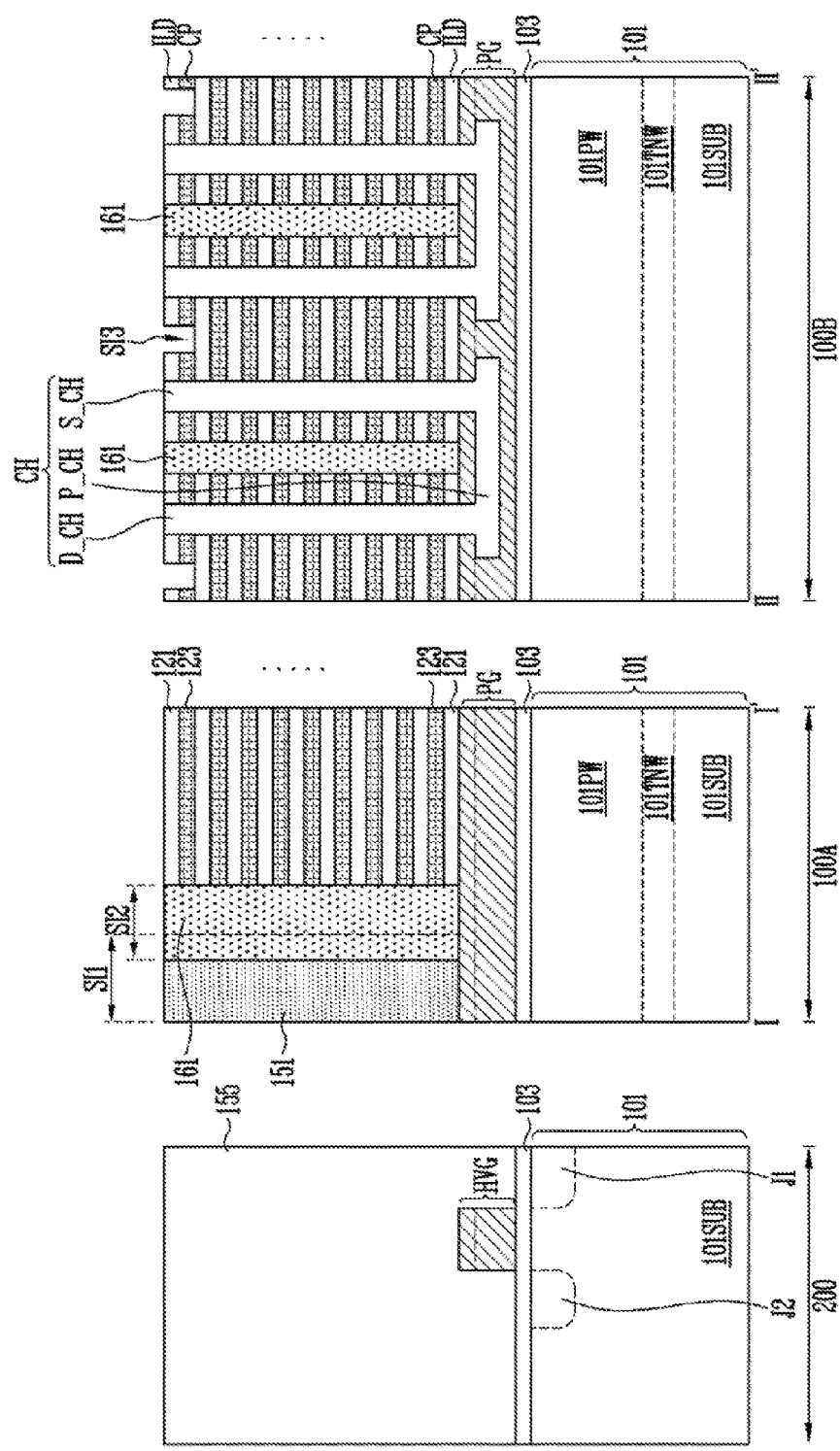

FIGS. 9A and 9B are a sectional view illustrating a process of forming conductive patterns. Referring to FIGS. 9A and 9B, the second material layers 123 exposed by the second slit SI2 are removed. In this case, the first slit insulating layer 151 may serve as a supporting platform supporting the first and second stacked structures. After that, a third conductive material is filled in the area in which the second material layers 123 are removed.

As shown in FIG. 9B, when the dummy hole DH is formed, the third conductive material may be filled in the inside of the dummy hole DH to form the dummy pattern DP.

Any one of the processes of forming the tunnel insulating layer (not shown), the data storage layer (not shown), and the blocking insulating layer (not shown), which surround the outer wall of the channel layer CH, may be additionally formed before the third conductive material is formed.

The tunnel insulating layer may be formed to contact the outer wall of the channel layer CH, the data storage layer may be formed to contact the outer wall of the tunnel insulating layer, and the blocking insulating layer may be formed to contact the outer wall of the data storage layer. Any one of the tunnel insulating layer, the data storage layer, and the blocking insulating layer may be formed along the surface of the dummy hole DH shown in FIG. 9B. In this case, the dummy pattern DP shown in FIG. 9B may be surrounded by the tunnel insulating layer, the data storage layer, the blocking insulating layer, or a stack thereof.

Referring to FIGS. 9A and 9B, after the third conductive material is formed, a portion of the third conductive material inside the second slit SI2 is removed, thereby forming conductive patterns CP which are disposed at different heights or levels and separated from each other. In this case, as shown in FIG. 9B, the dummy pattern DP may remain inside the dummy hole DH.

Referring to FIGS. 9A and 9B, the first material layers remain as interlayer dielectric layers ILD with any one of the conductive patterns CP, interposed therebetween.

After that, the second slit SI2 is filled with a second slit insulating layer 161. Subsequently, at least one conductive pattern from the topmost layer among the conductive patterns CP may be separated by a third slit SI13. The conductive pattern separated by the third slit SI3 may be used as a drain or a source select line shown in FIG. 3.

Subsequently, processes for forming a common source line, a bit line, a well pick-up area, a pick-up area, contact plugs, and a conductive line may be performed.

In the present disclosure, a dopant of a different type from a semiconductor substrate in the first area is implanted to form the well structure. The second area can be separated from the first area by the well structure.

In the present disclosure, a three-dimensional memory string is disposed on the first area, and a drive transistor controlling an operation of the three-dimensional memory string is disposed on the second area separated from the first area by the well structure. Accordingly, in the present disclosure, a current leakage path in the operation of the drive transistor can be blocked by the well structure, thereby improving the operating reliability of the three-dimensional memory string.

Figure 10:
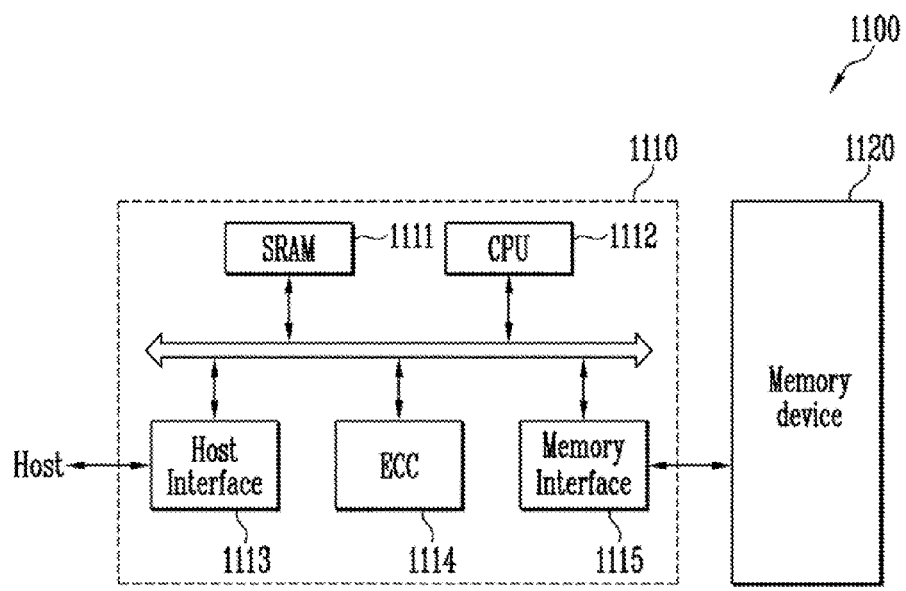
FIG. 10 is a configuration view illustrating a memory system according to an embodiment of the present disclosure.

FIG. 10 is a configuration view illustrating a memory system according to an embodiment of the present disclosure. Referring to FIG. 10, the memory system 1100 according to the embodiment of the present disclosure includes a memory device 1120 and a memory controller 1110.

The memory device 1120 has the structures of the embodiments described in FIGS. 1 to 9. Further, the memory device 1120 may be a multi-chip package formed of a plurality of flash memory chips.

The memory controller 1110 is configured to control the memory device 1120, and may include an SRAM 1111, a CPU 1112, a host interface 1113, an ECC 1114, and a memory interface 1115. The SRAM 1111 is used as an operation memory of the CPU 1112, the CPU 1112 performs a general control operation for data exchange of the memory controller 1110, and the host interface 1113 includes a data exchange protocol for a host connected with the memory system 1100. The ECC 1114 detects and corrects an error which may be included in data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a solid state disk (SSD), in which the memory device 1120 is combined with the controller 1110. For example, when the memory system 1100 is an SSD, the memory controller 1110 may communicate with the outside for example, the host through one among various interface protocols, such as USB, MMC, PCI-E, SATA, PATA, SCSI, ESDI, and IDE.

Figure 11:
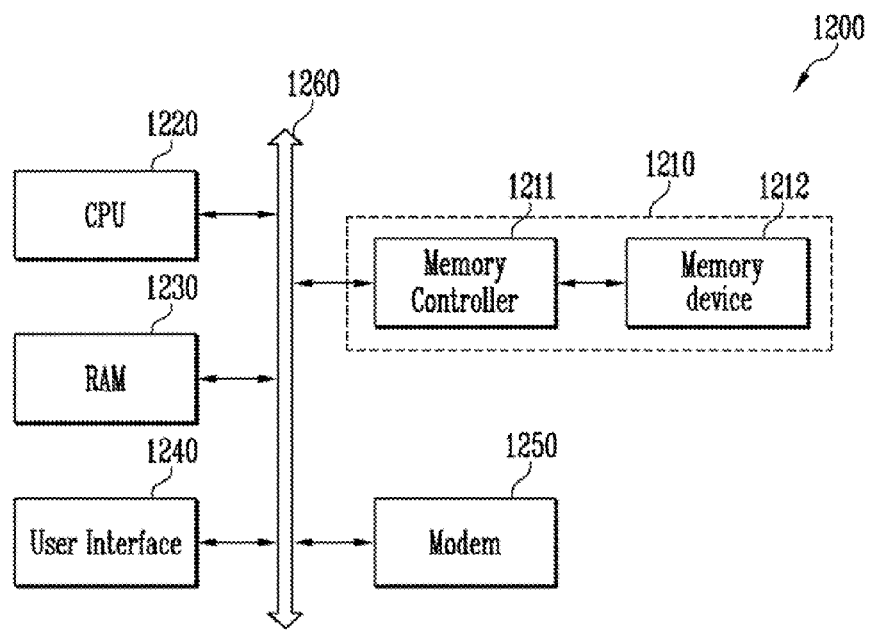
FIG. 11 is a configuration view illustrating a computing system according to an embodiment of the present disclosure.

FIG. 11 is a configuration view illustrating a computing system according to an embodiment of the present disclosure. Referring to FIG. 11, the computing system 1200 according to the embodiment of the present disclosure may include a CPU 1220, a RAM 1230, a user interface 1240, a modem 1250, and a memory system 1210, which are electrically connected to a system bus 1260. When the computing system 1200 is a mobile device, a battery for supplying an operation voltage to the computing system 1200 may be further included. An application chip set, a camera image processor (CIS), a mobile D-RAM, and the like may be further included.

The memory system 1210, as described with reference to FIG. 10, may be configured with a memory device 1212 and a memory controller 1211.

Example embodiments have been disclosed herein, and although specific terms are employed, those terms should be interpreted in a generic and descriptive sense only, and not for purpose of limitation. In some instances, as would be apparent to one of ordinary skill in the art from the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
   a semiconductor substrate divided into a first area and a second area, the semiconductor substrate including a first dopant of a first type;
   a first well formed to a first depth in the first area of the semiconductor substrate, the first well including a second dopant of a second type, wherein the second type is different from the first type;
   a second well including a third dopant of the first type, the second well being surrounded by the first well;
   a pipe gate formed on the first area of the semiconductor substrate, the pipe gate being electrically connected to the second well;
   a channel layer including a pipe channel layer, a source-side channel layer, and a drain-side channel layer, wherein the pipe channel layer is disposed in the pipe gate, wherein the source-side channel layer is coupled to the pipe channel layer, wherein the drain-side channel layer is coupled to the pipe channel layer;
   source-side conductive patterns surrounding the source-side channel layer, wherein the source-side conductive patterns are disposed at different levels from each other; and
   drain-side conductive patterns surrounding the drain-side channel layer, wherein the drain-side conductive patterns are disposed at different levels from each other,
   wherein at least one of the source-side conductive patterns and at least one of the drain-side conductive patterns form a memory block,
   wherein a first slit insulating layer is formed at a circumference of the memory block, and
   wherein a second slit insulating layer extends toward the first slit insulating layer from between any of the source-side conductive patterns and a neighboring drain-side conductive pattern.

2. The semiconductor device of claim 1,
   wherein a sidewall and a bottom of the second well are surrounded by the first well,
   wherein the second well is formed to a second depth, and
   wherein the second depth is shallower than the first depth.

3. The semiconductor device of claim 1,
   wherein the first type is a P type and the second type is an N type.

4. The semiconductor device of claim 1, further comprising:
   a contact plug extending between a top surface of the second well and a bottom surface of the pipe gate.

5. The semiconductor device of claim 4, further comprising:

a well pick-up area including a fourth dopant of the first type,
wherein the well pick-up area is formed in the second well and contacts the contact plug.

6. The semiconductor device of claim 5,
wherein a concentration of the fourth dopant is higher than that of the third dopant.

7. The semiconductor device of claim 1, further comprising:
a first contact plug coupled to the second well;
a second contact plug coupled to the pipe gate; and
a conductive line electrically connecting the first contact plug to the second contact plug.

8. The semiconductor device of claim 7, further comprising:
a well pick-up area including a fourth dopant of the first type,
wherein the well pick-up area is formed in the second well and contacts the first contact plug.

9. The semiconductor device of claim 8,
wherein a concentration of the fourth dopant is higher than that of the third dopant.

10. The semiconductor device of claim 1,
wherein the second slit insulating layer penetrates a sidewall of the first slit insulating layer.

11. The semiconductor device of claim 10, further comprising:
a dummy pattern overlapping the second slit insulating layer and penetrating the pipe gate.

12. The semiconductor device of claim 11,
wherein the dummy pattern is formed of a same conductive material as the source-side conductive patterns and the drain-side conductive patterns.

13. The semiconductor device of claim 1, further comprising:
a drive transistor formed over the second area.

14. A semiconductor device comprising:
a semiconductor substrate divided into a cell array area and a peripheral circuit area, the semiconductor substrate including a first dopant of a first type;
a first well formed to a first depth in the cell array area of the semiconductor substrate, the first well including a second dopant of a second type, wherein the second type is different from the first type;
a second well including a third dopant of the first type, the second well being surrounded by the first well;
a pipe gate formed on the cell array area of the semiconductor substrate, wherein the pipe gate overlays and is electrically connected to the second well in the cell array area of the semiconductor substrate; and
a pipe channel layer disposed in the pipe gate.

* * * * *